US009743529B2

(12) United States Patent
Lee et al.

(10) Patent No.: US 9,743,529 B2
(45) Date of Patent: Aug. 22, 2017

(54) MULTILAYER RIGID FLEXIBLE PRINTED CIRCUIT BOARD AND METHOD FOR MANUFACTURING THE SAME

(71) Applicant: SAMSUNG ELECTRO-MECHANICS CO., LTD., Suwon, Gyunggi-Do (KR)

(72) Inventors: Yang Je Lee, Cheongju-si (KR); Dek Gin Yang, Cheongwon-gun (KR); Dong Gi An, Gimhae-si (KR); Jae Ho Shin, Daejeon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 202 days.

(21) Appl. No.: 14/024,115

(22) Filed: Sep. 11, 2013

(65) Prior Publication Data
US 2014/0008107 A1    Jan. 9, 2014

Related U.S. Application Data

(63) Continuation of application No. 12/923,994, filed on Oct. 19, 2010, now Pat. No. 8,558,116.

(30) Foreign Application Priority Data

Oct. 28, 2009 (KR) .......................... 10-2009-0102783

(51) Int. Cl.
*H05K 3/02* (2006.01)
*H05K 3/06* (2006.01)
(Continued)

(52) U.S. Cl.
CPC ............. *H05K 3/06* (2013.01); *H05K 1/0218* (2013.01); *H05K 1/0278* (2013.01);
(Continued)

(58) Field of Classification Search
CPC ...... H05K 3/4691; H05K 3/06; H05K 1/0218; H05K 1/0278
(Continued)

(56) References Cited

U.S. PATENT DOCUMENTS 3,471,348 A * 10/1969 Iles ...................... H05K 3/4691
174/255
4,099,038 A * 7/1978 Purdy ..................... F41F 3/055
102/206
(Continued)

FOREIGN PATENT DOCUMENTS

JP         8-335758       12/1996
JP      2004-207490        7/2004
(Continued)

OTHER PUBLICATIONS

Korean Office Action issued Jul. 1, 2011 in corresponding Korean Patent Application No. 102009-0102783.
(Continued)

*Primary Examiner* — Peter DungBa Vo
*Assistant Examiner* — Kaying Kue
(74) *Attorney, Agent, or Firm* — NSIP Law (57) ABSTRACT

A multilayer rigid flexible printed circuit board including a flexible region including a flexible film having a circuit pattern formed on one or both surfaces thereof and a laser blocking layer formed on the circuit pattern and a rigid region formed adjacent to the flexible region and including a plurality of pattern layers on one or both surfaces of extended portions extended to both sides of the flexible film of the flexible region, and a method for manufacturing the same.

18 Claims, 8 Drawing Sheets

(51) Int. Cl.
   *H05K 1/02* (2006.01)
   *H05K 3/00* (2006.01)
   *H05K 3/28* (2006.01)
   *H05K 3/46* (2006.01)

(52) U.S. Cl.
   CPC ......... *H05K 3/4644* (2013.01); *H05K 3/4691* (2013.01); *H05K 3/0035* (2013.01); *H05K 3/281* (2013.01); *H05K 3/4652* (2013.01); *H05K 2201/0187* (2013.01); *H05K 2203/0554* (2013.01); *H05K 2203/1152* (2013.01); *Y10T 29/49128* (2015.01); *Y10T 29/49165* (2015.01)

(58) Field of Classification Search
   USPC ......... 29/852, 830, 831, 832, 846, 847, 829; 174/255, 261, 262; 257/659, 660, 774, 257/422
   See application file for complete search history.

(56) References Cited

U.S. PATENT DOCUMENTS

| | | | |
|---|---|---|---|
| 4,687,695 A * | 8/1987 | Hamby | H05K 3/4691 174/254 |
| 4,715,928 A * | 12/1987 | Hamby | H05K 3/4691 156/150 |
| 4,931,134 A * | 6/1990 | Hatkevitz | H05K 3/0035 156/150 |
| 5,206,463 A | 4/1993 | DeMaso et al. | |
| 5,854,534 A * | 12/1998 | Beilin | H01L 21/486 257/691 |
| 6,324,067 B1 * | 11/2001 | Nishiyama | H05K 1/165 174/262 |
| 6,350,387 B2 * | 2/2002 | Caron | H05K 3/4691 174/254 |
| 6,384,339 B1 * | 5/2002 | Neuman | H05K 3/363 174/254 |
| 6,555,917 B1 * | 4/2003 | Heo | H01L 23/3128 257/685 |
| 6,768,052 B2 | 7/2004 | Yamada et al. | |
| 6,902,949 B2 * | 6/2005 | Yamazaki | H01L 21/4857 174/254 |
| 7,082,679 B2 * | 8/2006 | Myoung | H05K 3/4691 29/825 |
| 7,258,549 B2 * | 8/2007 | Asahi | H01R 13/2414 174/255 |
| 7,291,795 B2 * | 11/2007 | Maharshak | H05K 1/0287 174/262 |
| 7,293,353 B2 * | 11/2007 | Matsuda | H05K 3/4691 156/150 |
| 7,347,950 B2 * | 3/2008 | Myung | C23C 26/00 216/13 |
| 7,423,219 B2 * | 9/2008 | Kawaguchi | H05K 3/361 174/254 |
| 7,596,863 B2 * | 10/2009 | Bhatt | H05K 1/112 174/254 |
| 7,759,582 B2 * | 7/2010 | Takahashi | H05K 1/115 174/262 |
| 7,982,135 B2 * | 7/2011 | Takahashi | H05K 3/4691 174/254 |
| 8,071,883 B2 * | 12/2011 | Takahashi | H05K 3/4691 174/254 |
| 8,479,389 B2 * | 7/2013 | Takahashi | H05K 3/4691 156/150 |
| 8,558,116 B2 * | 10/2013 | Lee | H05K 1/0218 174/254 |
| 8,631,567 B2 * | 1/2014 | Lee | H05K 3/429 156/184 |
| 9,038,266 B2 * | 5/2015 | Akai | H05K 3/384 174/255 |
| 2001/0010303 A1 * | 8/2001 | Caron | H05K 3/4691 216/18 |
| 2003/0164548 A1 * | 9/2003 | Lee | H01L 23/13 257/738 |
| 2005/0217895 A1 * | 10/2005 | Maharshak | H05K 1/0287 174/262 |
| 2006/0019075 A1 * | 1/2006 | Myoung | H05K 3/4691 428/209 |
| 2006/0156542 A1 * | 7/2006 | Matsuda | H05K 3/4691 29/846 |
| 2006/0169485 A1 * | 8/2006 | Kawaguchi | H05K 3/4691 174/254 |
| 2006/0180344 A1 * | 8/2006 | Ito | H01L 23/5385 174/262 |
| 2006/0193970 A1 * | 8/2006 | Myung | C23C 26/00 427/96.1 |
| 2006/0281343 A1 * | 12/2006 | Uchida | H05K 3/363 439/67 |
| 2007/0012475 A1 * | 1/2007 | Kawaguchi | H05K 3/361 174/255 |
| 2007/0126123 A1 * | 6/2007 | Sawachi | H05K 1/0212 257/777 |
| 2007/0269588 A1 * | 11/2007 | Lee | H05K 3/0035 427/97.2 |
| 2007/0281505 A1 * | 12/2007 | Kobayashi | H05K 3/4691 439/69 |
| 2008/0001241 A1 * | 1/2008 | Tuckerman | H01L 31/0203 257/434 |
| 2008/0014768 A1 * | 1/2008 | Lee | H05K 3/429 439/77 |
| 2008/0099230 A1 * | 5/2008 | Takahashi | H05K 3/4691 174/250 |
| 2009/0014205 A1 * | 1/2009 | Kobayashi | H05K 3/0052 174/255 |
| 2009/0114428 A1 * | 5/2009 | Ueno | H05K 3/28 174/254 |
| 2009/0255111 A1 * | 10/2009 | Takahashi | H05K 1/115 29/852 |
| 2010/0051325 A1 * | 3/2010 | Sato | H05K 3/4691 174/254 |
| 2010/0051326 A1 * | 3/2010 | Sagisaka | H05K 1/141 174/254 |
| 2010/0132980 A1 * | 6/2010 | Takahashi | H05K 1/142 174/250 |
| 2010/0162562 A1 * | 7/2010 | Lee | H05K 3/429 29/852 |
| 2011/0094776 A1 * | 4/2011 | Lee | H05K 1/0218 174/254 |
| 2011/0199739 A1 * | 8/2011 | Naganuma | H05K 3/4691 361/749 |
| 2011/0203837 A1 * | 8/2011 | Naganuma | H05K 3/4691 174/254 |
| 2012/0082779 A1 * | 4/2012 | Akai | H05K 3/384 427/97.2 |
| 2013/0014982 A1 * | 1/2013 | Segawa | H05K 1/141 174/263 |
| 2014/0034366 A1 * | 2/2014 | Otsubo | H05K 3/4691 174/254 |
| 2014/0345911 A1 * | 11/2014 | Lee | H05K 3/4691 174/251 |
| 2015/0053463 A1 * | 2/2015 | Chen | H05K 3/4644 174/254 |
| 2015/0060114 A1 * | 3/2015 | Park | H05K 3/4691 174/254 |
| 2015/0101847 A1 * | 4/2015 | Tsai | H05K 3/4691 174/254 |
| 2015/0114689 A1 * | 4/2015 | Ishihara | H05K 3/4691 174/251 |
| 2015/0114690 A1 * | 4/2015 | Ishihara | H05K 3/4691 174/251 |
| 2015/0189735 A1 * | 7/2015 | Yu | H05K 3/4691 174/251 |
| 2015/0195921 A1 * | 7/2015 | Onodera | H05K 3/281 174/258 |
| 2015/0319844 A1 * | 11/2015 | Kim | H05K 3/30 361/749 |

(56) References Cited

U.S. PATENT DOCUMENTS

| | | | |
|---|---|---|---|
| 2016/0037624 A1* | 2/2016 | Yu .................... | H05K 3/4655 |
| | | | 174/251 |
| 2016/0095207 A1* | 3/2016 | Taniguchi ............ | H05K 3/4691 |
| | | | 174/252 |
| 2016/0183363 A1* | 6/2016 | Lee ..................... | H05K 3/4691 |
| | | | 174/254 |

FOREIGN PATENT DOCUMENTS

| | | |
|---|---|---|
| JP | 10-2009-0017705 | 3/2006 |
| JP | 2006-59962 | 3/2006 |
| JP | 2006-173188 | 6/2006 |
| JP | 2008-34433 | 2/2008 |
| KR | 10-2008-0044798 | 5/2008 |
| KR | 10-907353 | 7/2009 |
| WO | 2008-050399 | 5/2008 |

OTHER PUBLICATIONS

Japanese Office Action dated May 15, 2012 issued in corresponding Japanese Patent Application No. 2010-236240.
Office Action issued by the Japanese Patent Office on Aug. 13, 2013 in the corresponding Japanese patent application No. 2012-250926.
Office Action issued Jul. 3, 2012 in corresponding U.S. Appl. No. 12/923,994.
Office Action issued Sep. 19, 2012 in corresponding U.S. Appl. No. 12/923,994.
Office Action issued Feb. 4, 2013 in corresponding U.S. Appl. No. 12/923,994.
Advisory Action issued Apr. 12, 2013 in corresponding U.S. Appl. No. 12/923,994.
Notice of Allowance issued May 24, 2013 in corresponding U.S. Appl. No. 12/923,994.

* cited by examiner

MULTILAYER RIGID FLEXIBLE PRINTED CIRCUIT BOARD AND METHOD FOR MANUFACTURING THE SAME

CROSS-REFERENCE TO RELATED APPLICATIONS

This application is a continuation of U.S. application Ser. No. 12/923,994 filed Oct. 19, 2010, now allowed, and claims the benefit of Korean Patent Application No. 10-2009-0102783 filed with the Korea Intellectual Property Office on Oct. 28, 2009, the disclosure of which is incorporated herein by reference.

BACKGROUND OF THE INVENTION

1. Field of the Invention

The present invention relates to a multilayer rigid flexible printed circuit board and a method for manufacturing the same, and more particularly, to a multilayer rigid flexible printed circuit board manufactured by a rigid build-up substrate manufacturing method after forming a laser stopper in a flexible region, and a method for manufacturing the same.

2. Description of the Related Art

A printed circuit board (PCB) is a circuit board which plays a role of electrically connecting or mechanically fixing predetermined electronic components and consists of an insulating layer made of a phenol resin or an epoxy resin and a copper foil layer attached to the insulating layer and having a predetermined wiring pattern formed thereon.

At this time, the PCBs are classified into a single-sided PCB in which wiring is formed only on one surface of an insulating layer, a double-sided PCB in which wirings are formed on both surfaces of an insulating layer, and a multilayer PCB in which wirings are formed in a plurality of layers, according to the number of stacked layers.

Recently, a multilayer printed circuit board, particularly, a rigid flexible printed circuit board (RFPCB) having flexibility has been at the center of a printed circuit board market due to miniaturization, thickness reduction, and high density of electronic products, and market interest in this has been increased.

The RFPCB includes a flexible region in which a circuit pattern is formed on a polyester or polyimide (PI) flexible film having flexibility and a rigid region in which an insulating layer is stacked on the flexible film to increase physical hardness.

This RFPCB has been used in devices requiring a high density circuit design such as notebooks, digital cameras, camcorders, and mobile communication terminals since it enables three dimensional wiring and is easily assembled.

SUMMARY OF THE INVENTION

The present invention has been proposed in order to solve the above-described problems, and it is, therefore, an object of the present invention to provide a multilayer rigid flexible printed circuit board capable of manufacturing both a flexible region and a rigid region by a rigid build-up manufacturing process after forming a laser stopper in the flexible region, and a method of manufacturing the same.

In accordance with an aspect of the present invention to achieve the object, there is provided a multilayer rigid flexible printed circuit board including: a flexible region including a flexible film having a circuit pattern formed on one or both surfaces thereof and a laser blocking layer formed on the circuit pattern; and a rigid region formed adjacent to the flexible region and including a plurality of pattern layers on one or both surfaces of extended portions extended to both sides of the flexible film of the flexible region.

Further, the laser blocking layer of the multilayer rigid flexible printed circuit board in accordance with the present invention may include an adhesive coated on the circuit pattern formed on the flexible film, a polyimide layer formed on the adhesive to protect the circuit pattern, and a copper foil layer formed on the polyimide layer.

Further, the laser blocking layer of the multilayer rigid flexible printed circuit board in accordance with the present invention may include an adhesive coated on the circuit pattern formed on the flexible film, a polyimide layer formed on the adhesive to protect the circuit pattern, an adhesive disposed on the polyimide layer, and a copper foil layer formed on the adhesive.

Further, the multilayer rigid flexible printed circuit board in accordance with the present invention may further include an electromagnetic shielding layer which is formed between the laser blocking layer and the flexible film having the circuit pattern formed thereon.

Further, the electromagnetic shielding layer of the multilayer rigid flexible printed circuit board in accordance with the present invention may include an adhesive coated on the circuit pattern formed on the flexible film, a polyimide layer formed on the adhesive to protect the circuit pattern, and a copper foil layer formed on the polyimide layer.

Further, the electromagnetic shielding layer of the multilayer rigid flexible printed circuit board in accordance with the present invention may include an adhesive coated on the circuit pattern formed on the flexible film, a polyimide layer formed on the adhesive to protect the circuit pattern, an adhesive disposed on the polyimide layer, and a copper foil layer formed on the adhesive.

Further, the rigid region of the multilayer rigid flexible printed circuit board in accordance with the present invention may further include at least one inner circuit pattern which is formed between the plurality of pattern layers to be electrically connected to the circuit pattern.

Further, the rigid region of the multilayer rigid flexible printed circuit board in accordance with the present invention may further include an outer circuit pattern which is formed on the outermost upper surface of the plurality of pattern layers to be electrically connected to the circuit pattern.

Further, the laser blocking layer or the electromagnetic shielding layer of the multilayer rigid flexible printed circuit board in accordance with the present invention may be extended to a region where at least one of a via hole and a through hole of the plurality of pattern layers is formed.

In accordance with another aspect of the present invention to achieve the object, there is provided a method for manufacturing a multilayer rigid flexible printed circuit board including the steps of: providing a base substrate including a flexible film having a circuit pattern formed on one or both surfaces thereof; forming a laser blocking layer to protect the circuit pattern of a flexible region of the base substrate; stacking a plurality of pattern layers on at least one surface of the base substrate having the laser blocking layer formed thereon; forming copper foil layers on upper surfaces of the plurality of pattern layers while interposing insulators therebetween and stacking an outer pattern layer having a via hole or a through hole formed therein; performing laser processing by forming windows in the via hole or the through hole of the outer pattern layer and the flexible region; and forming an outer circuit pattern by performing copper plating on the laser-processed outer pattern layer and etching portions of the copper plating layer.

Further, the step of providing the base substrate including the flexible film having the circuit pattern formed on the one or both surfaces thereof of the method for manufacturing the multilayer rigid flexible printed circuit board in accordance with the present invention may include the steps of providing the flexible film having a copper foil layer stacked on one or both surfaces thereof and forming the circuit pattern by etching the copper foil layer.

Further, the step of forming the laser blocking layer to protect the circuit pattern of the flexible region of the base substrate of the method for manufacturing the multilayer rigid flexible printed circuit board in accordance with the present invention may include the steps of coating an adhesive in the flexible region of the base substrate, forming a polyimide layer on the adhesive, and forming a copper foil layer on the polyimide layer.

Further, the step of forming the laser blocking layer to protect the circuit pattern of the flexible region of the base substrate of the method for manufacturing the multilayer rigid flexible printed circuit board in accordance with the present invention may include the steps of coating an adhesive in the flexible region of the base substrate, forming a polyimide layer on the adhesive, disposing an adhesive on the polyimide layer, and forming a copper foil layer on the adhesive.

Further, in the step of stacking the plurality of pattern layers on the at least one surface of the base substrate having the laser blocking layer formed thereon of the method for manufacturing the multilayer rigid flexible printed circuit board in accordance with the present invention, the plurality of pattern layers may be formed by repeating the step of forming one pattern layer including the steps of forming a copper foil layer while interposing at least one insulator and forming a via hole or a through hole in the insulator having the copper foil layer formed thereon and forming a circuit pattern by forming a copper plating layer on an upper surface of the insulator having the via hole or the through hole formed therein and etching portions of the copper plating layer.

Further, the step of performing the laser processing by forming the windows in the via hole or the through hole of the outer pattern layer and the flexible region of the method for manufacturing the multilayer rigid flexible printed circuit board may include the steps of forming copper foil openings in the via hole or the through hole of the outer pattern layer and the flexible region by window etching and removing the insulator by irradiating laser through the copper foil openings.

In accordance with still another aspect of the present invention to achieve the object, there is provided a method for manufacturing a multilayer rigid flexible printed circuit board including the steps of: providing a base substrate including a flexible film having a circuit pattern formed on one or both surfaces thereof; forming an electromagnetic shielding layer on the one or both surfaces of the flexible film having the circuit pattern formed thereon to protect the circuit pattern and shield electromagnetic waves; forming a laser blocking layer on the electromagnetic shielding layer or on the flexible film on which the electromagnetic shielding layer is not formed; stacking a plurality of pattern layers on one or both surfaces of the base substrate having the laser blocking layer formed thereon; forming copper foil layers on upper surfaces of the plurality of pattern layers while interposing insulators therebetween and stacking an outer pattern layer having a via hole or a through hole formed therein; performing laser processing by forming windows in the via hole or the through hole of the outer pattern layer and a flexible region; and forming an outer circuit pattern by performing copper plating on the laser-processed outer pattern layer and etching portions of the copper plating layer.

Further, in the step of forming the laser blocking layer on the electromagnetic shielding layer or on the flexible film on which the electromagnetic shielding layer is not formed of the method for manufacturing the multilayer rigid flexible printed circuit board in accordance with the present invention, the laser blocking layer may be formed on one or both surfaces of the base substrate.

Further, in the step of forming the electromagnetic shielding layer on the one or both surfaces of the flexible film having the circuit pattern formed thereon to protect the circuit pattern and shield the electromagnetic waves of the method for manufacturing the multilayer rigid flexible printed circuit board in accordance with the present invention, the electromagnetic shielding layer may be formed on one or both surfaces with respect to the base substrate.

Further, the step of providing the base substrate including the flexible film having the circuit pattern formed on the one or both surfaces thereof of the method for manufacturing the multilayer rigid flexible printed circuit board in accordance with the present invention may include the steps of providing the flexible film having a copper foil layer stacked on one or both surfaces thereof and forming the circuit pattern by etching portions of the copper foil layer.

Further, the step of forming the laser blocking layer or the electromagnetic shielding layer of the method for manufacturing the multilayer rigid flexible printed circuit board in accordance with the present invention may include the steps of disposing an adhesive in the flexible region of the base substrate, forming a polyimide layer on the adhesive layer, and forming a copper foil layer on the polyimide layer.

Further, the step of forming the laser blocking layer or the electromagnetic shielding layer of the method for manufacturing the multilayer rigid flexible printed circuit board in accordance with the present invention may include the steps of disposing an adhesive in the flexible region of the base substrate, forming a polyimide layer on the adhesive, disposing an adhesive on the polyimide layer, and forming a copper foil layer on the adhesive.

Further, the step of performing the laser processing by forming the windows in the via hole or the through hole of the outer pattern layer and the flexible region of the method for manufacturing the multilayer rigid flexible printed circuit board in accordance with the present invention may include the steps of forming copper foil openings in the via hole or the through hole of the outer pattern layer and the flexible region by window etching and removing the insulator by irradiating laser through the copper foil openings.

Further, the laser blocking layer or the electromagnetic shielding layer of the method for manufacturing the multilayer rigid flexible printed circuit board in accordance with the present invention may be extended to a region where at least one of a via hole and a through hole of the pattern layer is formed.

Further, a via hole formed in the electromagnetic shielding layer of the method for manufacturing the multilayer rigid flexible printed circuit board in accordance with the present invention may be formed to an upper portion of the copper foil layer of the electromagnetic shielding layer, and a through hole formed in the laser blocking layer and the electromagnetic shielding layer may be formed through the electromagnetic shielding layer, the laser blocking layer, and the base substrate.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

A multilayer rigid flexible printed circuit board and a method for manufacturing the same in accordance with certain embodiments of the present invention will be described below in detail with reference to the accompanying drawings. Those components that are the same or are in correspondence are rendered the same reference numeral regardless of the figure number, and redundant explanations are omitted.

Multilayer Rigid Flexible Printed Circuit Board

A multilayer rigid flexible printed circuit board in accordance with the present invention includes a flexible region F and a rigid region R. The flexible region F is a region which is made of a flexible material and where a bending portion is formed. The rigid region is a region which is made of a rigid material.

The flexible region F includes at least one flexible film having a first circuit pattern formed on at least one surface thereof, and a laser blocking layer may be formed on at least one surface of the first circuit pattern.

Further, an electromagnetic shielding layer may be further formed on the laser blocking layer of the flexible region F to shield electromagnetic waves.

The rigid region R is formed adjacent to the flexible region F and may include a plurality of pattern layers on at least one surface of an extended portion of the at least one flexible film.

Hereafter, various embodiments of the multilayer rigid flexible printed circuit board in accordance with the present invention will be specifically described.

<Multilayer Rigid Flexible Printed Circuit Board>

First Embodiment

Figure 1:
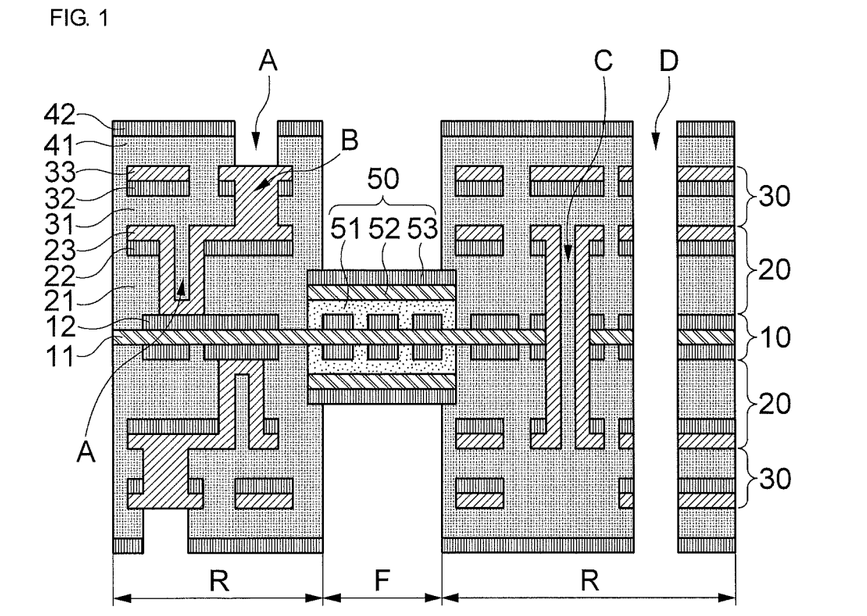
FIGS. 1 to 3 are views showing a cross section of a multilayer rigid flexible printed circuit board in accordance with a first embodiment of the present invention.
Figure 2:
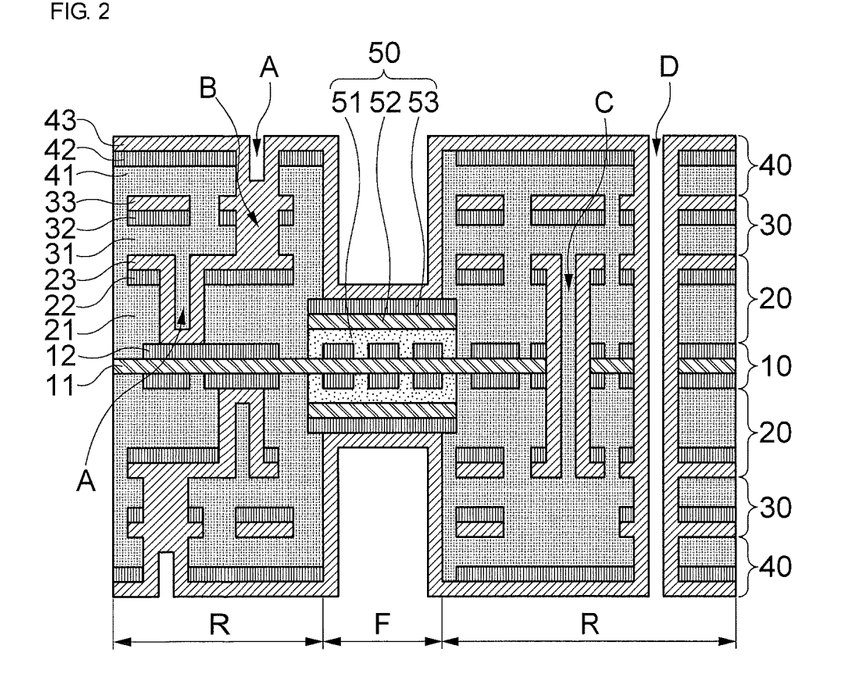
Figure 3:
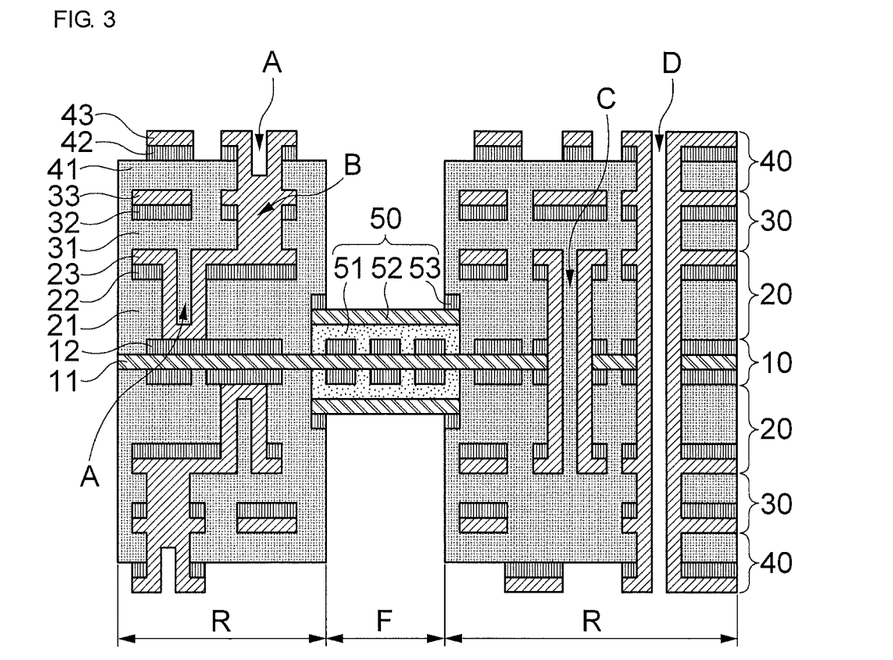

FIGS. 1 to 3 are views showing a cross section of a multilayer rigid flexible printed circuit board in accordance with a first embodiment of the present invention.

As shown in FIGS. 1 to 3, a multilayer rigid flexible printed circuit board in accordance with a first embodiment of the present invention includes a flexible region F and a rigid region R, and a laser blocking layer 50 is formed in the flexible region F.

The laser blocking layer 50 is formed on a base substrate 10 in the flexible region F, and a plurality of pattern layers 20, 30, and 40 are formed on the base substrate 10 in the rigid region R.

First, when describing a structure of the flexible region F, the flexible region F has the structure in which the laser blocking layer 50 is formed on the base substrate 10.

The base substrate 10 includes at least one flexible film 11 having a first circuit pattern 12 formed on at least one surface thereof, and the laser blocking layer 50 is formed on at least one surface of the first circuit pattern 12.

The laser blocking layer 50 includes an adhesive 51, a polyimide layer 52, and a copper foil layer 53, and the adhesive 51 is disposed on the first circuit pattern 12.

The polyimide layer 52 is formed to protect the first circuit pattern 12, the polyimide layer 52 and the first circuit pattern 12 are formed while interposing the adhesive 51 therebetween, and the copper foil layer 53 is formed on the polyimide layer 52.

After copper plating 43 is performed on the copper foil layer 53 of the laser blocking layer 50 to form an outer layer circuit pattern, the outer layer circuit pattern is formed by etching portions of the copper plating 43 in correspondence to the circuit pattern (referring to FIGS. 2 and 3).

The laser blocking layer 50 may be formed in various embodiments and will be described in detail in FIGS. 4a, 4b, and 5b.

Further, the layer blocking layer 50 may be extended to the rigid region R.

For example, each side surface of the copper foil layer 53 of the laser blocking layer 50 may be formed smaller than that of the polyimide layer 52 formed on a lower surface of the copper coil layer 53 by more than 10 μm or the laser blocking layer 50 may be extended to the rigid region R from a boundary surface between the flexible region F and the rigid region R by 0.05 to 5 mm.

Next, the rigid region R is formed adjacent to the flexible region F and includes a plurality of pattern layers 20, 30, and 40 on at least one surface of an extended portion of the at least one flexible film 11.

Generally, one pattern layer is formed by sequentially stacking an insulator and a copper foil layer on a lower pattern layer, forming a via hole or a through hole in the insulator and the copper foil layer, performing copper plating on the insulator and the copper foil layer having the via hole or the through hole formed therein, and etching the insulator and the copper foil layer according to a circuit pattern.

Here, the insulator may be prepreg or a rigid material, and the copper foil layer may be formed by a casting, laminating, or sputtering method.

The via hole is a plated through hole formed on the insulator which is formed under the copper foil layer to be electrically connected to the lower circuit pattern, and the plated through hole passes through the base substrate to be electrically connected to the circuit pattern formed at an opposite side of the base substrate.

The via hole or the through hole is a plated through hole formed by computer numerical control (CNC) drilling or laser drilling to electrically connect an outer layer circuit pattern and an inner layer circuit pattern.

The multilayer rigid flexible printed circuit board in accordance with the present invention includes the plurality of pattern layers 20, 30, and 40 and a plurality of via holes A and B or through holes C and D for electrically connecting outer circuit patterns 42 and 43 and inner circuit patterns 12, 22, 23, 32, and 33.

Second Embodiment

Figure 9:
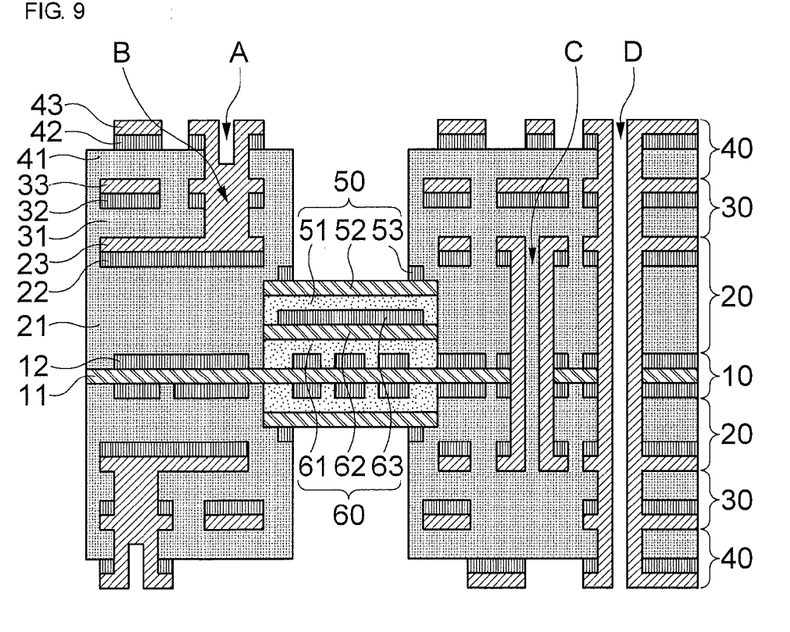
FIG. 9 is a view showing a cross section of a multilayer rigid flexible printed circuit board in accordance with a second embodiment of the present invention.

FIG. 9 is a view showing a cross section of a multilayer rigid flexible printed circuit board in accordance with a second embodiment of the present invention.

As shown in FIG. 9, a multilayer rigid flexible printed circuit board in accordance with a second embodiment of the present invention includes a flexible region F and a rigid region R, and a laser blocking layer 50 and an electromagnetic shielding layer 60 are formed in the flexible region F.

The other components are the same as those of a multilayer rigid flexible printed circuit board in accordance with a first embodiment, and only the components different from those of the multilayer rigid flexible printed circuit board in accordance with a first embodiment will be described in detail.

The multilayer rigid flexible printed circuit board in accordance with a second embodiment has a structure in which the electromagnetic shielding layer 60 is further formed in a stacked structure of the multilayer rigid flexible printed circuit board in accordance with a first embodiment.

That is, the laser blocking layer 50 and the electromagnetic shielding layer 60 are formed on a base substrate 10 in the flexible region F, and a plurality of pattern layers 20, 30, and 40 are formed on the base substrate 10 in the rigid region R.

The laser blocking layer 50 may be formed on one surface of a single-sided printed circuit board or on both surfaces of a double-sided printed circuit board.

The electromagnetic shielding layer 60 may be formed between the laser blocking layer 50 and a flexible film 11 of the single-sided printed circuit board or between the both laser blocking layers 50 and the flexible film 11 of the double-sided printed circuit board (referring to FIG. 9).

Specifically, the flexible region F has a structure in which the electromagnetic shielding layer 60 is formed on the base substrate 10, and the base substrate 10 includes the at least one flexible film 11 having a first circuit pattern 12 formed on at least one surface thereof.

The electromagnetic shielding layer 60 is formed on at least one or both surfaces of the first circuit pattern 12, and the laser blocking layer 50 is formed on the electromagnetic shielding layer 60 or on the flexible film 11 where the electromagnetic shielding layer 60 is not formed.

The laser blocking layer 50 or the electromagnetic shielding layer 60 includes an adhesive 51 or 61, a polyimide layer 52 or 62, and a copper foil layer 53 or 63, and the adhesive 51 or 61 is disposed on the first circuit pattern 12.

The polyimide layer 52 is formed to protect the first circuit pattern 12, the polyimide layer 52 and the first circuit pattern 12 are formed while interposing the adhesive 51 therebetween, and the copper foil layer 53 is formed on the polyimide layer 52.

After copper plating 43 is performed on the copper foil layer 53 of the laser blocking layer 50 to form an outer layer circuit pattern, the outer layer circuit pattern is formed by etching portions of the copper plating 43 in correspondence to the circuit pattern (referring to FIG. 9).

A stacked structure of the laser blocking layer 50 or the electromagnetic shielding layer 60 may be formed in various embodiments and will be described in detail in FIGS. 6a, 6b, 7a, and 7b.

The laser blocking layer 50 or the electromagnetic shielding layer 60 may be extended to the rigid region R, and the laser blocking layer 50 or the electromagnetic shielding layer 60 extended to the rigid region R is not removed by laser processing.

For example, the laser blocking layer 50 or the electromagnetic shielding layer 60 may be extended to the rigid region R from a boundary surface between the flexible region F and the rigid region R by 0.05 to 5 mm.

Third Embodiment

Figure 10:
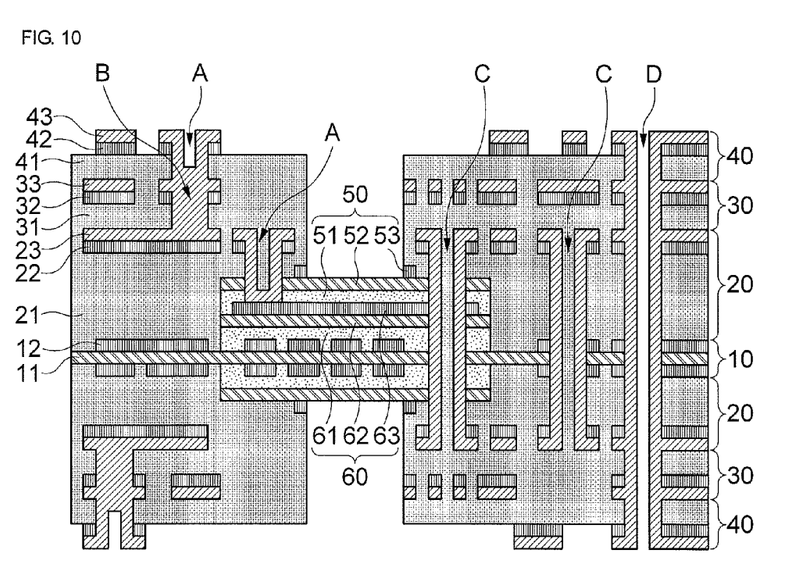
FIG. 10 is a view showing a cross section of a multilayer rigid flexible printed circuit board in accordance with a third embodiment of the present invention.

FIG. 10 is a view showing a cross section of a multilayer rigid flexible printed circuit board in accordance with a third embodiment of the present invention.

As shown in FIG. 10, a multilayer rigid flexible printed circuit board in accordance with a third embodiment of the present invention includes a flexible region F and a rigid region R, and a laser blocking layer 50 and an electromagnetic shielding layer 60 are formed in the flexible region F.

The other components are the same as those of a multilayer rigid flexible printed circuit board in accordance with a first embodiment, and only the components different from those of the multilayer rigid flexible printed circuit board in accordance with a first embodiment will be described in detail.

The multilayer rigid flexible printed circuit board in accordance with a third embodiment has a structure in which the electromagnetic shielding layer 60 is further formed in a stacked structure of the multilayer rigid flexible printed circuit board in accordance with a first embodiment, and a via hole A or a through hole C is formed in the laser blocking layer 50 and the electromagnetic shielding layer 60.

The flexible region F has a structure in which the electromagnetic shielding layer 60 is formed on a base substrate 10, and the base substrate 10 includes at least one flexible film 11 having a first circuit pattern 12 formed on at least one surface thereof.

The electromagnetic shielding layer 60 is formed on at least one or both surfaces of the first circuit pattern 12, and the laser blocking layer 50 is formed on the electromagnetic shielding layer 60 or on the flexible film 11 where the electromagnetic shielding layer 60 is not formed.

The laser blocking layer 50 or the electromagnetic shielding layer 60 includes an adhesive 51 or 61, a polyimide layer 52 or 62, and a copper foil layer 53 or 63, and the adhesive 61 is disposed on the first circuit pattern 12.

The polyimide layer 62 of the electromagnetic shielding layer 60 is formed to protect the first circuit pattern 12, the polyimide layer 62 and the first circuit pattern 12 are formed while interposing the adhesive 61 therebetween, and the copper foil layer 63 is formed on the polyimide layer 62.

After copper plating 43 is performed on the copper foil layer 53 of the laser blocking layer 50 to form an outer layer circuit pattern, the outer layer circuit pattern is formed by etching portions of the copper plating 43 in correspondence to the circuit pattern (referring to FIG. 10).

A stacked structure of the laser blocking layer 50 or the electromagnetic shielding layer 60 may be formed in various embodiments and will be described in detail in FIGS. 6a, 6b, 7a, and 7b.

The laser blocking layer 50 or the electromagnetic shielding layer 60 may be extended to the rigid region R.

The laser blocking layer 50 or the electromagnetic shielding layer 60 extended to the rigid region R is not removed by laser processing, and the via hole A or the through holes C and D formed in the rigid region R pass through some or all of the laser blocking layer 50 and the electromagnetic shielding layer 60.

For example, as shown in FIG. 10, a second circuit pattern 23 formed on a fifth pattern layer 20 may be electrically grounded by being connected to the copper foil layer 63 of the electromagnetic shielding layer 60 through the via hole A.

Further, the second circuit pattern 23 formed on the fifth pattern layer 20 may be connected to a second circuit pattern 23 formed on a third pattern layer 20 by passing through the electromagnetic shielding layer 60 and the laser blocking layer 50 through the through holes C and D.

That is, the through holes C and D can ground the circuit patterns of the upper and lower pattern layers with respect to the base substrate 10.

<Laser Blocking Layer>

Figure 4A:
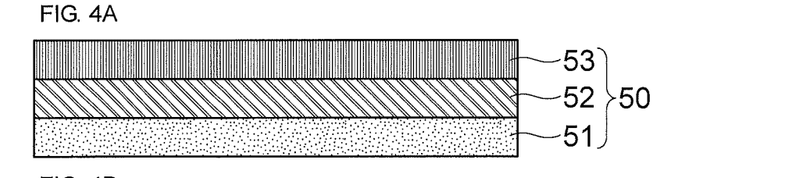
FIGS. 4a and 4b are views showing a cross section of a laser blocking layer in accordance with an embodiment of the present invention.
Figure 4B:
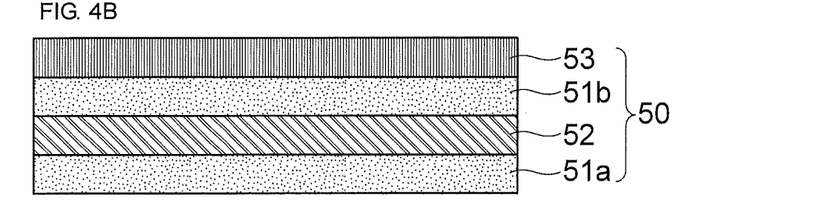
Figure 5:
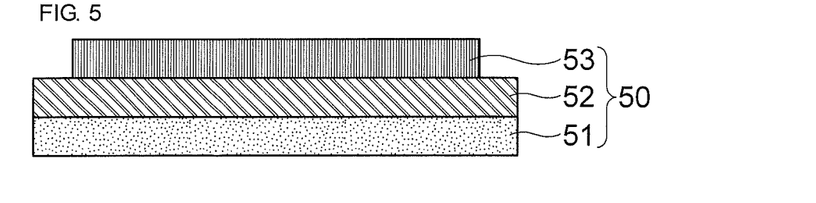
FIG. 5 is a view showing a cross section of a laser blocking layer in accordance with another embodiment of the present invention.

FIGS. 4a, 4b, and 5 are views showing various embodiments of a laser blocking layer.

First Embodiment

As shown in FIG. 4a, a laser blocking layer 50 in accordance with a first embodiment of the present invention is formed in a three-layer structure including an adhesive 51, a polyimide layer 52, and a copper foil layer 53.

The polyimide layer 52 is formed to protect a circuit pattern, and the polyimide layer 52 and the circuit pattern are formed while interposing the adhesive 51 therebetween, and the copper foil layer 53 is formed on the polyimide layer 52.

Second Embodiment

As shown in FIG. 4b, a laser blocking layer 50 in accordance with a second embodiment of the present invention is formed in a four-layer structure including a first adhesive 51a, a second adhesive 51b, a polyimide layer 52, and a copper foil layer 53.

It is possible to improve a stacked structure by interposing the first adhesive 51a and the second adhesive 51b between the polyimide layer 52 and the circuit pattern and between the polyimide layer 52 and the copper foil layer 53.

Third Embodiment

As shown in FIG. 5, both ends of a copper foil layer 53 of a laser blocking layer 50 in accordance with a third embodiment of the present invention are formed shorter than both ends of a polyimide layer 52.

That is, the both ends of the polyimide layer 52 of a flexible region F are extended to a rigid region R, and the copper foil layer 53 formed on the polyimide layer 52 is also extended to the rigid region R.

The above method of forming the laser blocking layer 50 is just one embodiment, and the laser blocking layer 50 may be formed by various methods.

<Electromagnetic Shielding Layer>

FIGS. 6a, 6b, 7a, and 7b are views showing various embodiments of a stacked structure of a laser blocking layer and an electromagnetic shielding layer.

First Embodiment

Figure 6A:
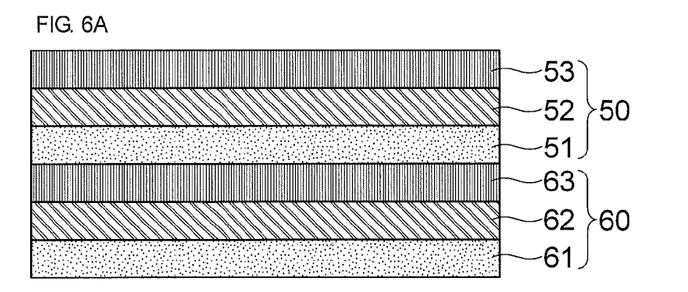
FIGS. 6a and 6b are views showing various embodiments of a stacked structure of a laser blocking layer and an electromagnetic shielding layer in accordance with an embodiment of the present invention.
Figure 6B:
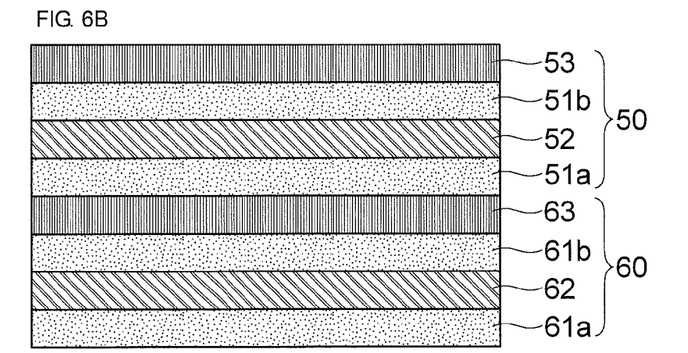

FIG. 6a is a view showing a stacked structure of a three-layer laser blocking layer 50 and a three-layer electromagnetic shielding layer 60, and FIG. 6b is a view showing a stacked structure of a four-layer laser blocking layer 50 and a four-layer electromagnetic shielding layer 60.

The laser blocking layer 50 and the electromagnetic shielding layer 60 include adhesives 51 and 61, polyimide layers 52 and 62, and copper foil layers 53 and 63, respectively. The adhesive is disposed on at least one (referring to FIG. 6a) or both (referring to FIG. 6b) of upper and lower surfaces of the polyimide layers 52 and 62.

That is, both of the laser blocking layer 50 and the electromagnetic shielding layer 60 are formed in three layers of the adhesives 51 and 61, the polyimide layers 52 and 62, and the copper foil layers 53 and 63 or in four layers of the first adhesives 51a and 61a, the polyimide layers 52 and 62, the second adhesives 51b and 61b, and the copper foil layers 53 and 63.

Further, the laser blocking layer 50 may be formed in three layers, and the electromagnetic shielding layer 60 may be formed in four layers. Or, the laser blocking layer 50 may be formed in four layers, and the electromagnetic shielding layer 60 may be formed in three layers.

Second Embodiment

Figure 7A:
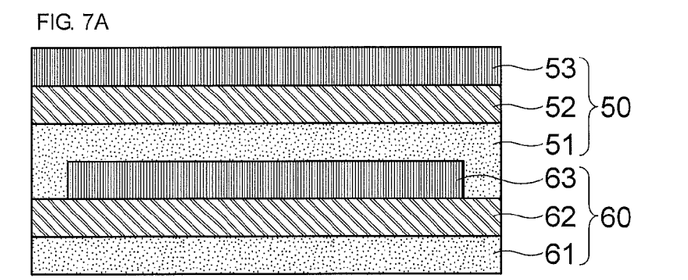
FIGS. 7a and 7b are views showing various embodiments of a stacked structure of a laser blocking layer and an electromagnetic shielding layer in accordance with another embodiment of the present invention.
Figure 7B:
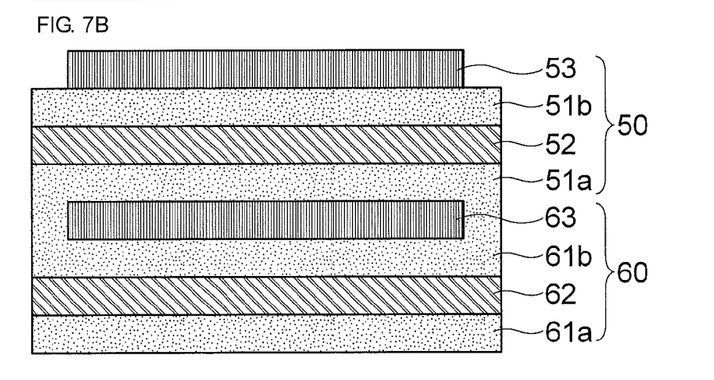

FIG. 7a shows that a copper foil layer 63 of an electromagnetic shielding layer 60 is formed shorter than a polyimide layer 62 in a stacked structure of the laser blocking layer 50 and the electromagnetic shield layer 60 shown in FIG. 6a, and FIG. 7b shows that the copper foil layer 63 of the electromagnetic shielding layer 60 and a copper foil layer 53 of the laser blocking layer 50 are formed shorter than the polyimide layer 52 or 62 of the electromagnetic shielding layer 60 or the laser blocking layer 50.

The above embodiment is just one embodiment of the present invention, and the stacked structure may be variously formed.

The above method of forming the electromagnetic shielding layer 60 is just one embodiment, and the electromagnetic shielding layer 60 may be formed by various methods.

Method for Manufacturing Multilayer Rigid Flexible Printed Circuit Board

A method for manufacturing a multilayer rigid flexible printed circuit board in accordance with the present invention includes the steps of providing a base substrate, forming a laser blocking layer, stacking a plurality of pattern layers, and forming an outer pattern layer.

FIGS. 8a to 8j are views showing a method for manufacturing a multilayer rigid flexible printed circuit board in accordance with an embodiment of the present invention.

Figure 8A:
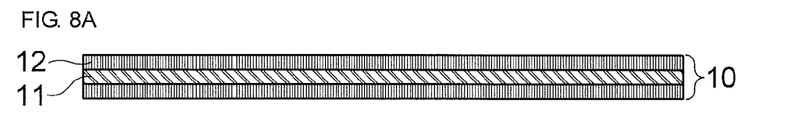
FIGS. 8a to 8j are views showing a method for manufacturing a multilayer rigid flexible printed circuit board in accordance with an embodiment of the present invention.
Figure 8B:
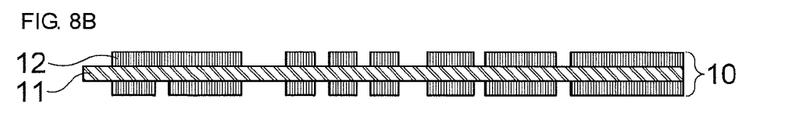

As shown in FIGS. 8a and 8b, in the step of providing a base substrate 10, a first circuit pattern 12 is formed by stacking a copper foil layer 12 on at least one surface of a flexible film 11 and etching the copper foil layer 12.

Figure 8C:
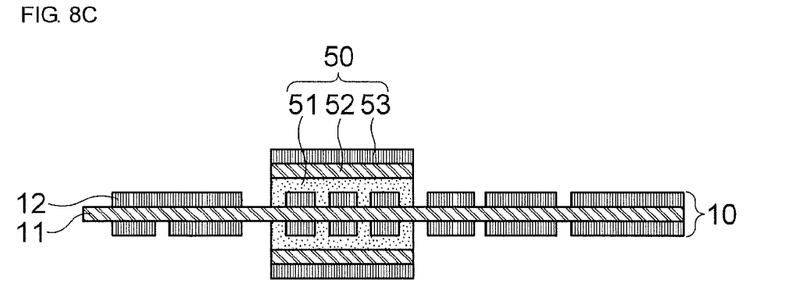

As shown in FIG. 8c, a laser blocking layer 50 is completed by forming a polyimide layer 52 in a flexible region F of the base substrate 10 while interposing an adhesive 51 therebetween and forming a copper foil layer 53 on the polyimide layer 52.

Further, the laser blocking layer 50 is completed by forming the polyimide layer 52 in the flexible region F of the base substrate 10 while interposing a first adhesive 51a therebetween and forming the copper foil layer 53 on the polyimide layer 52 while interposing a second adhesive 51b therebetween.

At this time, each side surface of the copper foil layer formed on the adhesive may be formed smaller than the polyimide layer formed on a lower surface by 10 μm.

Further, the laser blocking layer 50 may be extended to a rigid region R from a boundary surface between the flexible region F and the rigid region R by 0.05 to 5 mm.

Figure 8D:
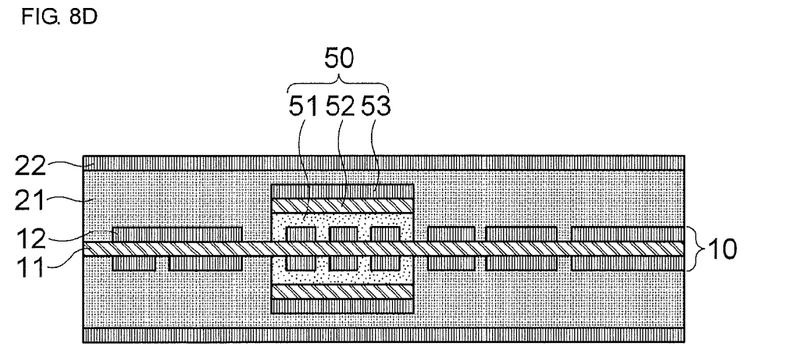
Figure 8E:
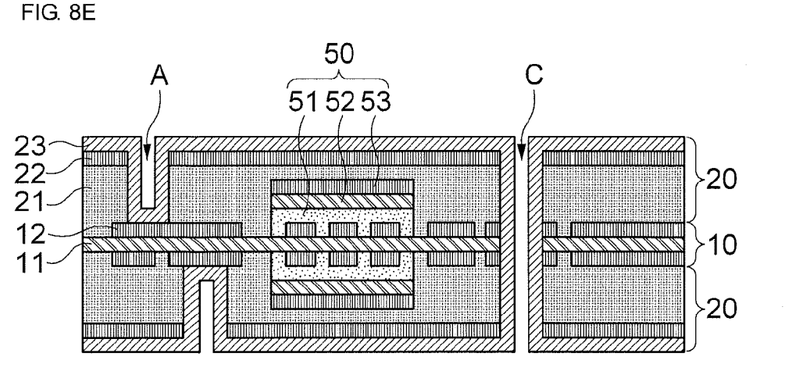
Figure 8F:
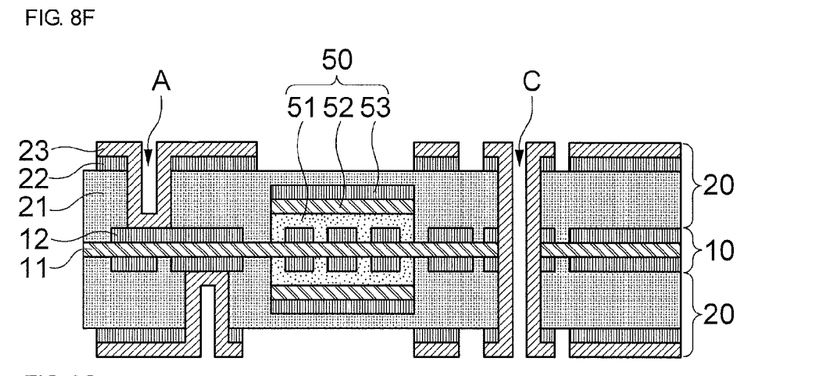
Figure 8G:
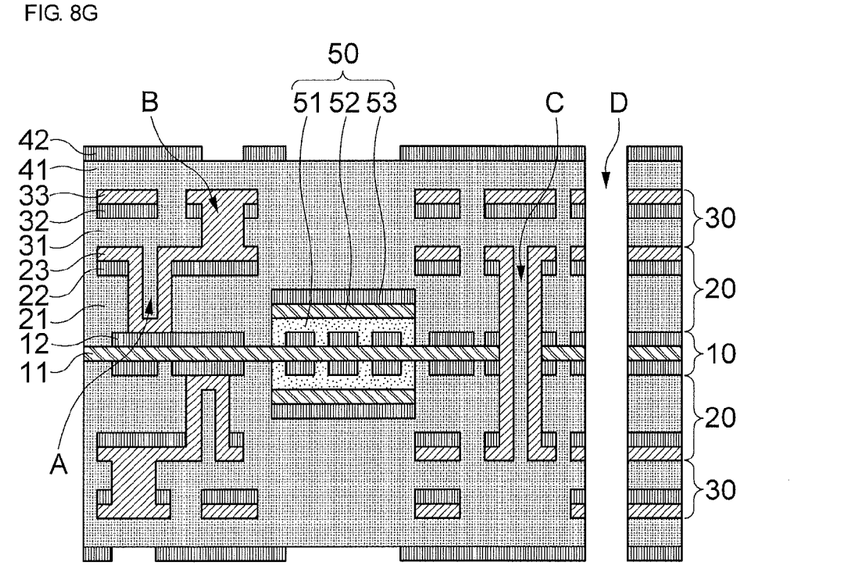
Figure 8H:
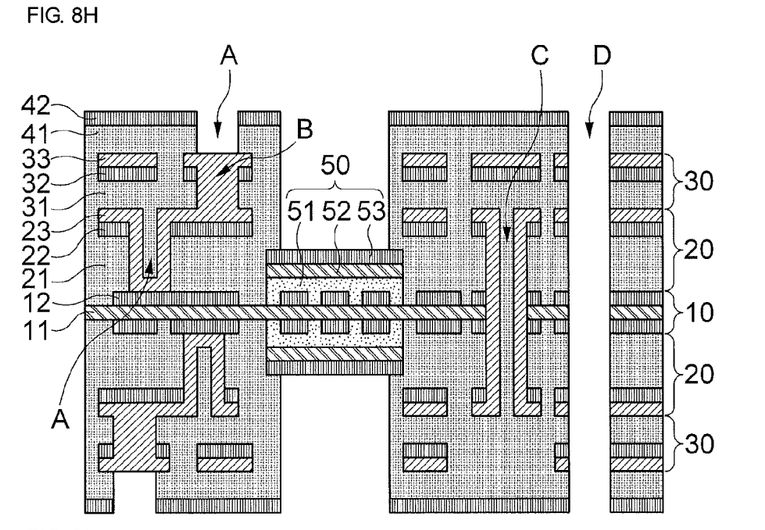
Figure 8I:
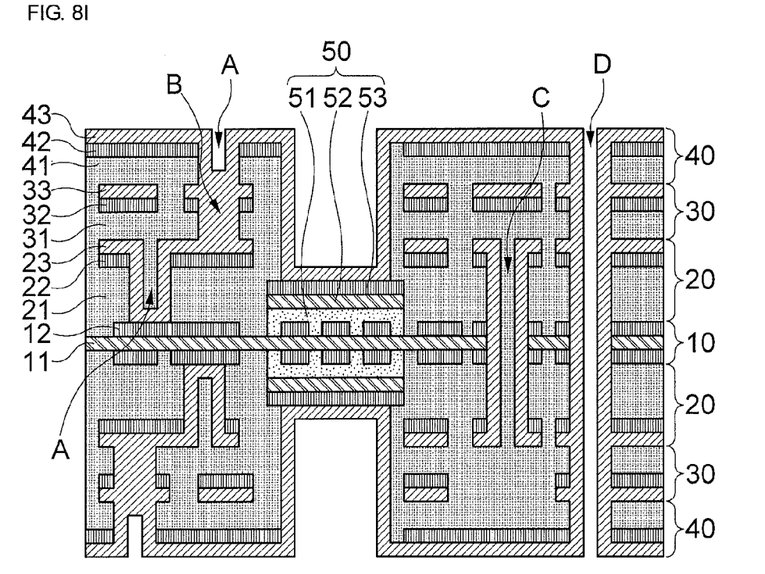
Figure 8J:
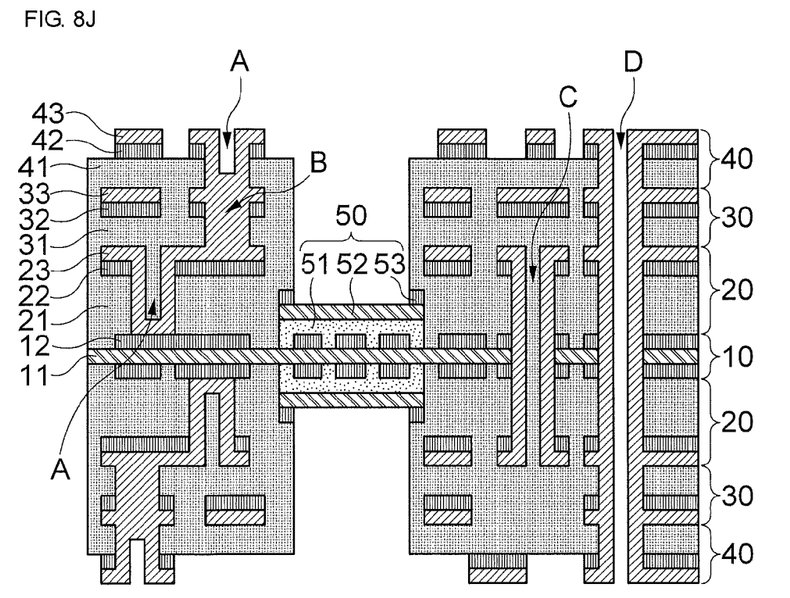

As shown in FIGS. 8d to 8f, in the step of stacking a plurality of pattern layers 20 and 30, one pattern layer is formed by forming a copper foil layer 22 or 32 while interposing at least one insulator 21 or 31, forming via holes A and B or through holes C and D in portions of the insulator 21 or 31 or the copper foil layer 22 or 32, and forming a circuit pattern 23 or 33 after performing copper plating on the copper foil layer 22 or 32 having the via holes A and B or the through holes C and D formed therein, and the plurality of pattern layers are formed by repeating the above steps.

As shown in FIGS. 8g to 8j, in the step of forming an outer pattern layer 40, an outer circuit pattern is formed by forming a copper foil layer 42 on the plurality of pattern layers 20 and 30 while interposing at least one insulator 41 therebetween, forming a via hole or a through hole, forming windows in the via hole or the through hole of the outer pattern layer 40 and the flexible region, and performing laser processing on the windows.

Here, the method of forming the outer circuit pattern by forming the windows and performing the laser processing on the windows forms the outer circuit pattern by forming copper foil openings in the via hole or the through hole of the outer pattern layer and the flexible region through window etching, irradiating laser through the copper foil openings to remove the insulator, performing copper plating on the outer pattern layer from which the insulator is removed, and etching portions of the outer pattern layer.

Further, a method for manufacturing a multilayer rigid flexible printed circuit board in another embodiment of the present invention can protect devices from external electromagnetic waves by providing a base substrate, forming a laser blocking layer, and further forming an electromagnetic shielding layer on the laser blocking layer.

In an embodiment of the present invention, since the flexible region is manufactured without window processing by using materials and equipment of a rigid build-up substrate, it is possible to achieve process simplification and cost reduction and minimize scale change. Therefore, there is an effect of utilizing an existing rigid substrate production line without change.

Further, since general prepreg can be used as the insulator used for manufacturing the rigid flexible printed circuit board instead of no flow prepreg, there are effects of improving filling performance and reducing cost.

Further, since the electromagnetic shielding layer is further provided, there is an effect of minimizing influence of external electromagnetic waves.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method for manufacturing a multilayer rigid flexible printed circuit board comprising:
   providing a base substrate including a flexible film having a first circuit pattern formed on one or both surfaces thereof, the flexible film having an area corresponding to an area of the multilayer rigid flexible printed circuit board;
   forming a laser blocking layer on the first circuit pattern of a flexible region of the base substrate, the laser blocking layer including a copper foil layer;
   disposing a plurality of pattern layers on at least one surface of the base substrate having the laser blocking layer formed thereon, each of the pattern layers having an insulator and a second circuit pattern formed on the insulator layer;
   disposing an outer pattern layer having a via hole or a through hole formed therein;
   performing laser processing to form a window by removing portions of the plurality of pattern layers and the out pattern layers, which are disposed on the flexible region; and
   forming an outer circuit pattern by performing copper plating on the laser-processed outer pattern layer and etching portions of the copper plating layer,
   wherein the first circuit pattern of the flexible region of the base substrate is protected by the laser blocking layer during the performing laser processing and the flexible region of the base substrate remains in the window after the performing laser processing,
   wherein the etching portions of the copper plating layer includes removing a portion of the copper foil layer of the laser blocking layer disposed in the window, and, after the laser processing, a portion of the copper foil layer of the laser blocking layer remains in the rigid region adjacent to the window.

2. The method according to claim 1, wherein the providing the base substrate including the flexible film having the first circuit pattern formed on the one or both surfaces thereof includes:
   providing the flexible film having a copper foil layer disposed on one or both surfaces thereof; and
   forming the first circuit pattern by etching the copper foil layer.

3. The method according to claim 1, wherein the forming the laser blocking layer on the first circuit pattern of the flexible region of the base substrate includes:
   coating an adhesive in the flexible region of the base substrate;
   forming a polyimide layer on the adhesive; and
   forming the copper foil layer on the polyimide layer.

4. The method according to claim 1, wherein the forming the laser blocking layer on the first circuit pattern of the flexible region of the base substrate includes:
   coating an adhesive in the flexible region of the base substrate;
   forming a polyimide layer on the adhesive;

disposing an adhesive on the polyimide layer; and
forming the copper foil on the adhesive.

5. The method according to claim 1, wherein in the disposing the plurality of pattern layers on the at least one surface of the base substrate having the laser blocking layer formed thereon, the plurality of pattern layers are formed by repeating steps of:
forming the insulator;
forming a copper foil layer on the insulator;
forming at least one of a via hole or a through hole in the insulator having the copper foil layer formed thereon; and
forming the second circuit pattern by forming a copper plating layer on an upper surface of the insulator having the via hole or the through hole formed therein and etching portions of the copper plating layer.

6. A method for manufacturing a multilayer rigid flexible printed circuit board comprising:
providing a base substrate including a flexible film having a circuit pattern formed on one or both surfaces thereof, the flexible film having an area corresponding to an area of the multilayer rigid flexible printed circuit board;
forming an electromagnetic shielding layer on the one or both surfaces of the flexible film having the circuit pattern formed thereon to protect the circuit pattern and shield electromagnetic waves;
forming a laser blocking layer on the electromagnetic shielding layer or on the flexible film on which the electromagnetic shielding layer is not formed;
disposing a plurality of pattern layers on one or both surfaces of the base substrate having the laser blocking layer formed thereon;
forming copper foil layers on upper surfaces of the plurality of pattern layers while interposing insulators therebetween and disposing an outer pattern layer having a via hole or a through hole formed therein;
performing laser processing to form a window in the flexible region and a via hole or a through hole of the outer pattern layer; and
forming an outer circuit pattern by performing copper plating on the laser-processed outer pattern layer and etching portions of the copper plating layer.

7. The method according to claim 6, wherein in the forming the laser blocking layer on the electromagnetic shielding layer or on the flexible film on which the electromagnetic shielding layer is not formed, the laser blocking layer is formed on one or both surfaces of the base substrate.

8. The method according to claim 6, wherein in the forming the electromagnetic shielding layer on the one or both surfaces of the flexible film having the circuit pattern formed thereon to protect the circuit pattern and shield electromagnetic waves, the electromagnetic shielding layer is formed on one or both surfaces with respect to the base substrate.

9. The method according to claim 6, wherein the providing the base substrate including the flexible film having the circuit pattern formed on one or both surfaces thereof includes:
providing the flexible film having a copper foil layer disposed on one or both surfaces thereof; and
forming the circuit pattern by etching portions of the copper foil layer.

10. The method according to claim 6, wherein the forming the laser blocking layer or the electromagnetic shielding layer includes:
disposing an adhesive in the flexible region of the base substrate;
forming a polyimide layer on the adhesive;
disposing an adhesive on the polyimide layer; and
forming a copper foil layer on the adhesive.

11. The method according to claim 6, wherein the forming the laser blocking layer or the electromagnetic shielding layer includes:
disposing an adhesive in the flexible region of the base substrate;
forming a polyimide layer on the adhesive; and
forming a copper foil layer on the polyimide layer.

12. The method according to claim 11, wherein the etching portions of the copper plating layer includes removing the copper foil layer of the laser blocking layer disposed in the window, and, after the laser processing, a portion of the copper foil layer of the laser blocking layer remains in the rigid region adjacent to the window.

13. The method according to claim 6, wherein the laser blocking layer or the electromagnetic shielding layer is extended to a region where at least one of a via hole and a through hole of the pattern layer is formed.

14. The method according to claim 13, wherein a via hole formed in the electromagnetic shielding layer is formed to an upper portion of the copper foil layer of the electromagnetic shielding layer, and a through hole formed in the laser blocking layer and the electromagnetic shielding layer is formed through the electromagnetic shielding layer, the laser blocking layer, and the base substrate.

15. A method for manufacturing a multilayer rigid flexible printed circuit board comprising:
providing a base substrate including a flexible film having a first circuit pattern formed on one or both surfaces thereof, the flexible film having an area corresponding to an area of the multilayer rigid flexible printed circuit board and the base substrate having a flexible region and a rigid region;
forming a laser blocking layer including a copper layer, on the flexible region and a portion of the rigid region, which is adjacent to the flexible region;
disposing a plurality of pattern layers on at least one surface of the base substrate having the laser blocking layer formed thereon, each of the pattern layers having an insulator and a second circuit pattern formed on the insulator;
performing laser processing to form a window by removing portions of the plurality of pattern layers, disposed on the flexible region; and
removing a portion of the copper layer on the flexible region such that the other portion of the copper layer remains on the portion of the rigid region, while maintaining the flexible region of the base substrate.

16. The method according to claim 15, wherein the laser blocking layer further comprises a first adhesive layer on the flexible region of the base substrate, and a polyimide layer between the first adhesive layer and the copper layer.

17. The method according to claim 16, wherein the first adhesive layer and the polyimide layer remain on the flexible region of the base substrate, after removing the portion of the copper layer.

18. The method according to claim 16, wherein the laser blocking layer further comprises a second adhesive layer between the polyimide layer and the copper layer.

* * * * *